United States Patent
Kirchberger et al.

(10) Patent No.: US 6,797,880 B2
(45) Date of Patent: Sep. 28, 2004

(54) PLASTIC FRAME FOR THE MOUNTING OF AN ELECTRONIC HEAVY-CURRENT CONTROL UNIT

(75) Inventors: Michael Kirchberger, Neutraubling (DE); Stefan Kulig, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 5 days.

(21) Appl. No.: 10/175,310

(22) Filed: Jun. 19, 2002

(65) Prior Publication Data

US 2002/0195262 A1 Dec. 26, 2002

(30) Foreign Application Priority Data

Jun. 20, 2001 (DE) .................................. 101 29 788.2

(51) Int. Cl.⁷ ............................................. H02K 5/00
(52) U.S. Cl. .................. 174/52.1; 174/50; 174/52.4; 361/715; 361/807; 257/718
(58) Field of Search ................. 174/52.1, 52.4, 174/50, 252, 16.1, 16.3, 135, 50.2; 361/715, 704, 707, 709, 710, 758, 807, 809, 732; 257/718, 719, 726, 727

(56) References Cited

U.S. PATENT DOCUMENTS

| | | | | |
|---|---|---|---|---|
| 5,329,426 A | * | 7/1994 | Villani ........................ | 361/704 |
| 5,353,194 A | | 10/1994 | Libretti et al. .............. | 361/707 |
| 5,615,735 A | * | 4/1997 | Yoshida et al. ............. | 361/709 |
| 5,834,335 A | * | 11/1998 | Buschbom ................. | 438/107 |
| 5,847,928 A | * | 12/1998 | Hinshaw et al. ........... | 361/704 |
| 5,894,408 A | | 4/1999 | Stark et al. ................. | 361/704 |
| 6,084,178 A | * | 7/2000 | Cromwell .................. | 174/35 R |
| 6,097,601 A | * | 8/2000 | Lee ............................. | 361/704 |
| 6,101,096 A | * | 8/2000 | MacGregor et al. ....... | 174/16.1 |
| 6,141,220 A | * | 10/2000 | Lin ............................ | 174/16.3 |
| 6,243,264 B1 | * | 6/2001 | Bollesen et al. ........... | 361/704 |
| 6,249,436 B1 | * | 6/2001 | Bollesen .................... | 361/720 |
| 6,307,747 B1 | * | 10/2001 | Farnsworth et al. ....... | 361/704 |
| 6,349,032 B1 | * | 2/2002 | Chan et al. ................. | 361/704 |
| 6,375,475 B1 | * | 4/2002 | Brodsky ..................... | 439/66 |
| 6,385,048 B2 | * | 5/2002 | Mellberg et al. ........... | 361/704 |
| 6,400,577 B1 | * | 6/2002 | Goodwin et al. .......... | 361/816 |
| 6,449,155 B1 | * | 9/2002 | Colbert et al. ............. | 174/16.3 |
| 6,459,582 B1 | * | 10/2002 | Ali et al. .................... | 361/704 |
| 6,459,586 B1 | * | 10/2002 | Miller et al. ............... | 174/252 |
| 6,473,306 B2 | * | 10/2002 | Koseki et al. .............. | 361/704 |
| 6,611,431 B1 | * | 8/2003 | Lee et al. .................... | 257/719 |

FOREIGN PATENT DOCUMENTS

| | | | |
|---|---|---|---|
| DE | 198 07 718 A1 | 9/1999 | ............ H05K/7/20 |
| DE | 198 36 887 A1 | 2/2000 | ............ H05K/7/20 |
| EP | 0 375 776 A1 | 7/1990 | ............ H05K/7/02 |
| EP | 0 516 149 A1 | 12/1992 | ............ H05K/1/14 |

* cited by examiner

Primary Examiner—Dean Reichard
Assistant Examiner—Angel R. Estrada
(74) Attorney, Agent, or Firm—Baker Botts L.L.P.

(57) ABSTRACT

A plastic frame (8) serves for the simple mounting of an electronic heavy-current control unit. It has cutouts (20, 21, 22, 23, 24) for the positionally accurate receiving of busbars (4, 5, 6, 7; 4a; 4b; 4c), metal plates (3) and electrical/electronic components (9; 9a to 9g) and also the potting compound (10) thereof and is provided with integrally formed snap-action elements (11, 12) for connection to a heat sink (1).

20 Claims, 4 Drawing Sheets

PLASTIC FRAME FOR THE MOUNTING OF AN ELECTRONIC HEAVY-CURRENT CONTROL UNIT

BACKGROUND OF THE INVENTION

The invention relates to a plastic frame for the mounting of an electronic heavy-current control unit, in particular for a motor vehicle. Such control units have a number of power semiconductor components and also a number of capacitors for smoothing the on-board voltages generated. These elements must on the one hand be supplied with operating voltages, and on the other hand the heavy current generated must be conducted away. Moreover, the heat generated must be dissipated, which requires a complicated cooler, often a water-cooled heat sink. All these elements must be arranged on a common carrier and be mounted in a vibration-resistant manner on account of the use in a motor vehicle.

To date, the individual elements such as power semiconductor components, capacitors, busbars, heat sinks, etc. have been fixed by screws individually on a circuit board, which has required a high work outlay. Moreover, the elements have been potted with a vibration-damping sil gel, which has required a considerable amount of sil gel in the course of mounting on a circuit board.

SUMMARY OF THE INVENTION

The object of the invention, therefore, is to specify a measure which simplifies and reduces the costs of the mounting of an electronic heavy-current control unit, in particular for a motor vehicle.

The object is achieved by means of a plastic frame for the mounting of an electronic heavy-current control unit with cutouts for the positionally accurate receiving of busbars, metal plates and electrical/electronic components and also the potting compound thereof and with integrally formed snap-action elements for connection to a heat sink. An advantageous development is specified in the subclaims.

Accordingly, the plastic frame has cutouts for the positionally accurate receiving of busbars, metal plates and electrical/electronic components and also the potting compound thereof and integrally formed snap-action elements for connection to a heat sink. The plastic frame thus serves for fixing the busbars and the power semiconductor components and enables simple, time-saving connection to a heat sink on account of the snap-action elements. The cutouts for receiving the power semiconductor components also function, in a particularly advantageous manner, as wells for receiving the vibration-damping sil gel which protects the bonding wire connections of the semiconductor components, so that only a significantly smaller amount thereof is required.

The entire arrangement is accommodated in a housing and can be mounted with a spring element against the housing for the purpose of further vibration damping. The spring element additionally presses the elements fixed by the plastic frame according to the invention against the heat sink, so that better cooling can be effected by reduction of the thermal contact resistance between heat sink and the thermally loaded elements. In a development according to the invention, the spring element may be a constituent part of the plastic frame.

BRIEF DESCRIPTION OF THE DRAWINGS

The invention is explained in more detail below using exemplary embodiments with the aid of figures, in which.

DETAILED DESCRIPTION OF THE PREFERRED EMBODIMENTS

Figure 1:
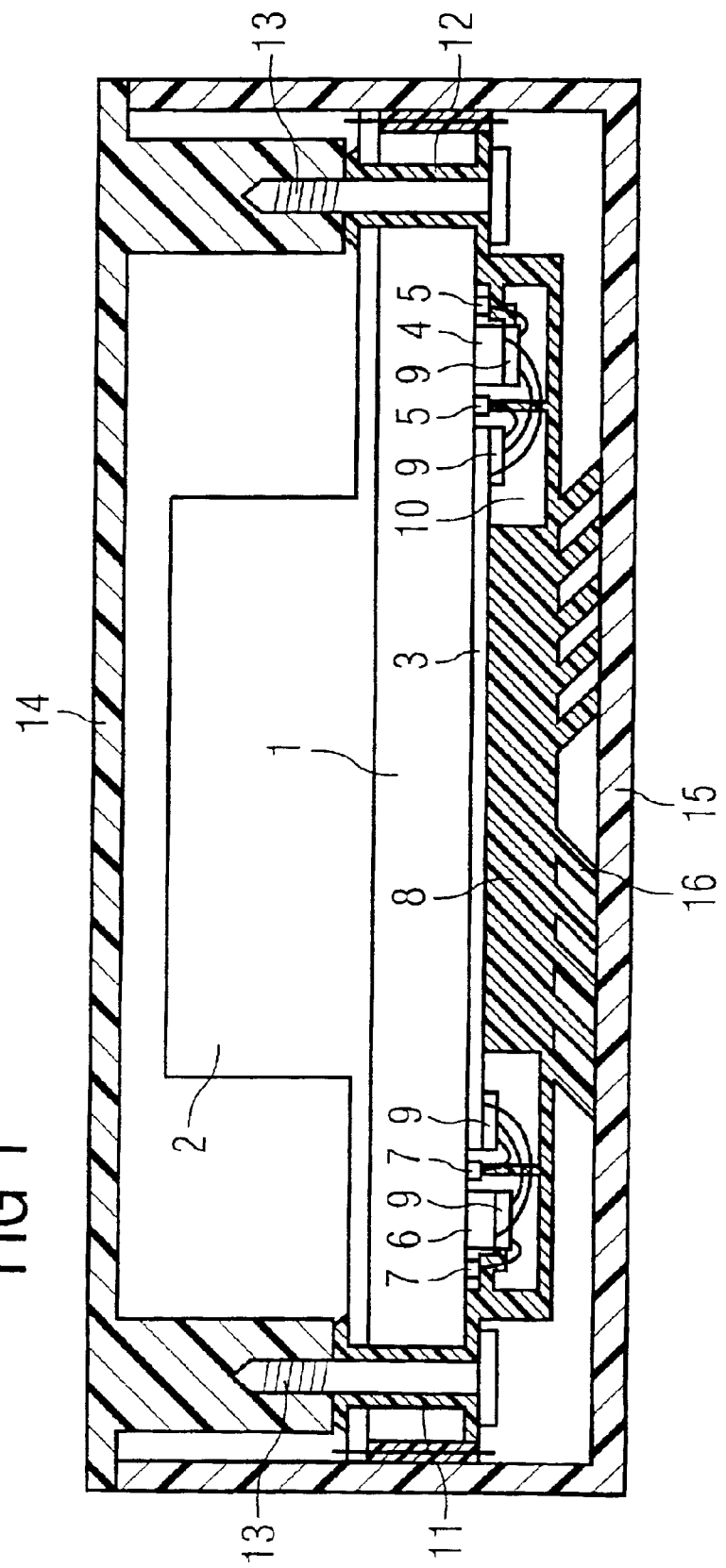
FIG. 1 shows a cross-sectional illustration of a control unit housing with a first variant of a plastic frame according to the invention.

FIG. 1 shows a heat sink 1, on one of whose sides a deep-drawn sheet 2 is arranged. Electronic components are situated within the deep-drawn sheet 2. Arranged on the other side of the heat sink 1 are a printed circuit board 3 comprising two metal plates which are insulated from one another by an insulating film, and busbars 4, 5, 6, 7. The printed circuit board 3 and the busbars 4, 5, 6, 7 are fixed in their position by a plastic frame 8 according to the invention. For this purpose, the plastic frame 8 has cutouts in order to receive these elements with an accurate fit. The busbars may be embodied in a rigid or flexible manner.

The plastic frame additionally has cutouts for receiving power semiconductor components 9, which are arranged on the printed circuit board 3 or a part of the busbars 4, 6 and are electrically connected to other busbars 5, 7 by means of bonding wires. The cutouts for receiving the power semiconductor components 9 are embodied in well form and filled with a sil gel 10. The sil gel 10 serves for the mechanical protection of the bonding wires and additionally has a vibration-damping action. The plastic frame 8 leads, in a particularly advantageous manner, to a minimization of the required amount of sil gel.

Snap-action elements 11, 12 are integrally formed on the plastic frame 8, which elements project through holes in the heat sink 1 and in the deep-drawn sheet 2 and engage behind the heat sink 1 and the deep-drawn sheet 2 by means of lugs and thus produce a fixed connection of heat sink 1, deep-drawn sheet 2, plastic frame 8 and the elements fixed by the plastic frame 8. This connection can be produced by simply pressing the individual parts together, without requiring time-consuming screwing activities, which leads to a considerable saving of costs in the mounting of these parts.

The previously described unit comprising heat sink 1, deep-drawn sheet 2 and plastic frame 8 is connected to a first housing part 14 by means of screws 13. On account of the previously described connection technique, only a small number of four screws is necessary, which saves costs since the heat sink is water-cooled and is therefore hollow, so that holes are very complicated to realize since they must be watertight.

A second housing part 15 is placed onto the first housing part 14 and screwed to the first housing part 14. The plastic frame 8 is provided with a spring element 16, through which, on the one hand, the plastic frame 8 and the printed circuit board 3 fixed by it and the busbars 4, 5, 6, 7 are pressed against the heat sink 1 and, on the other hand, the individual elements are protected against vibrations. The spring element 16 may either be formed in one piece with the plastic frame 8 or be placed onto the latter.

Figure 2:
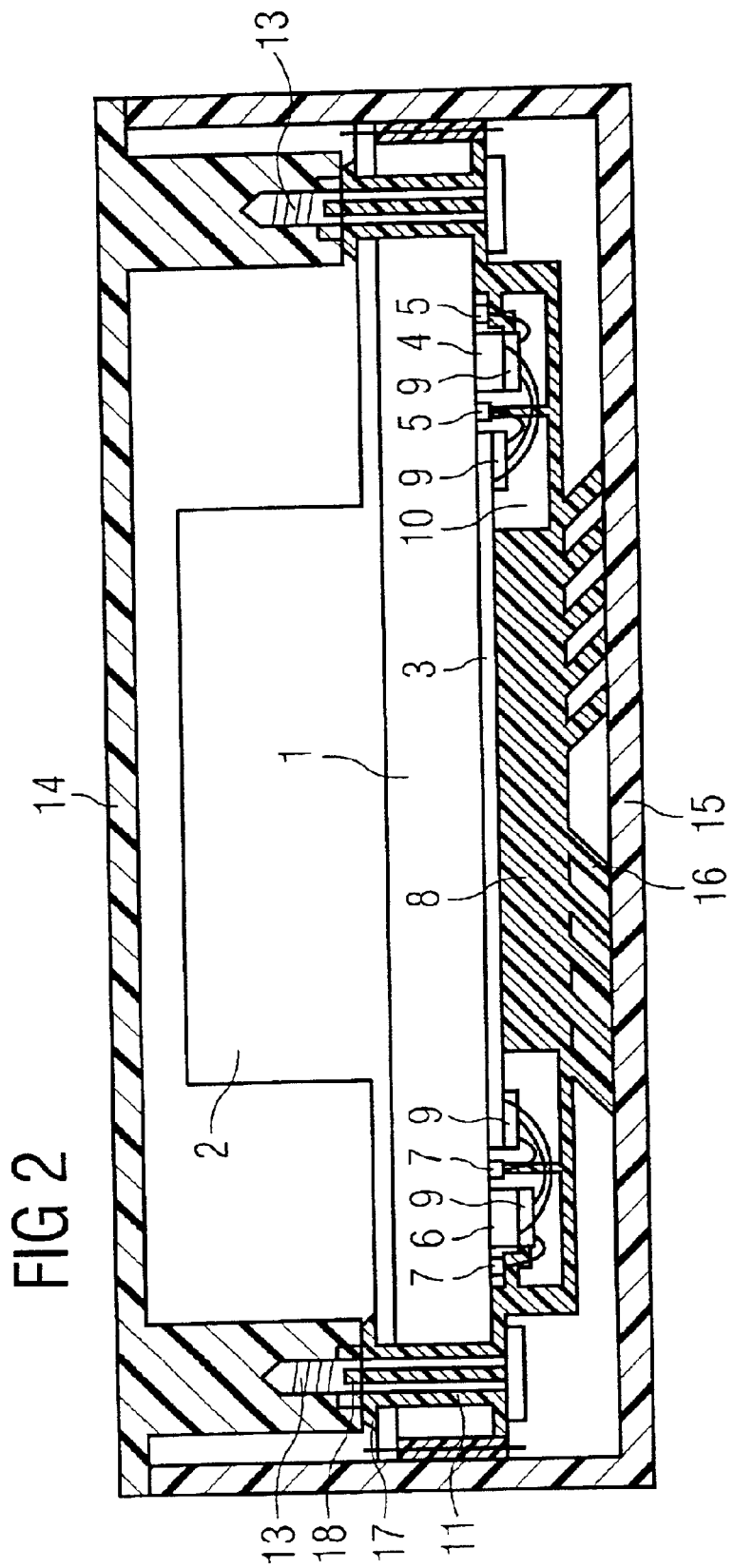
FIG. 2 shows a cross-sectional illustration of a control unit housing with a second variant of a plastic frame according to the invention.

FIG. 2 shows a second variant of the control unit construction, in the illustration of which identical parts are provided with the same reference symbols as in FIG. 1 and need not be described any further. In contrast to the first variant in accordance with FIG. 1, here, by means of the snap-action element 11 integrally formed on the plastic frame 8, only the plastic frame 8 is snapped onto the heat sink 1 by means of the lugs 17. The deep-drawn sheet 2 is snapped onto the snap-action element 11 by means of a second snap-action element 18.

Figure 3:
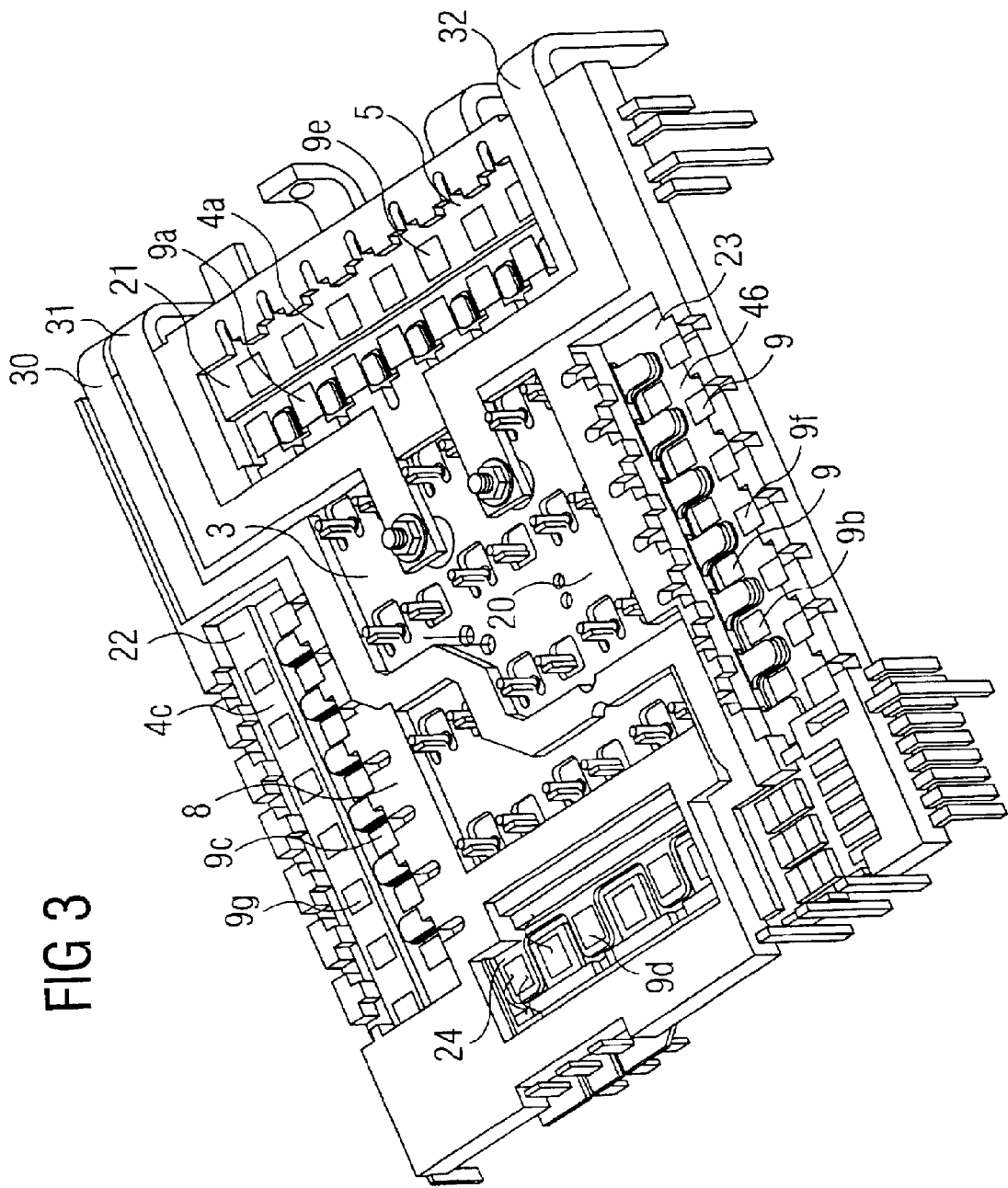
FIG. 3 shows a perspective illustration of a plastic frame according to the invention with inserted elements.

A perspective illustration of a plastic frame 8 according to the invention with inserted busbars 4a, 4b, 4c, 5, inserted printed circuit board 3 and power semiconductor components 9 can be seen in the plan view in FIG. 3. As can be discerned, in the exemplary embodiment illustrated, the plastic frame has a central cutout 20 which is covered by the printed circuit board 3 from the underside. The cutout 20 is necessary since parts of the printed circuit board 3 are angled in order to be able to make contact with the components arranged on the printed circuit board 3. These angled parts, which are soldered to the connections of the components, are received by the cutout 20. The printed circuit board 3 additionally projects into cutouts 21, 22, 23, 24. A part of the power semiconductor components 9a, 9b, 9c, 9d are arranged on the parts of the printed circuit board 3 which project into the cutouts 21, 22, 23, 24.

Busbars 4a, 4b, 4c are additionally inserted into the cutouts 21, 22, 23, 24 from the underside, the remaining power semiconductor components 9e, 9f, 9g being arranged on said busbars. After the power semiconductor components have been wired, the cutouts 21, 22, 23, 24 are filled with sil gel in order to protect the bonding wires. The arrangement of the power semiconductor components in the cutouts 21, 22, 23, 24 makes it possible to minimize the amount of sil gel. Further busbars 30, 31, 32 are arranged from above in further cutouts in the plastic frame 8.

By means of the plastic frame 8 according to the invention, almost all the elements required for the control unit can be fixed with an accurate fit yet in a simple manner, which can clearly be discerned in the illustration of FIG. 3.

Instead of the arrangement of the busbars in cutouts of the plastic frame 8, at least a part thereof can also be encapsulated by injection-molding directly during the production of the plastic frame and thus be embedded in the plastic frame.

Figure 4:
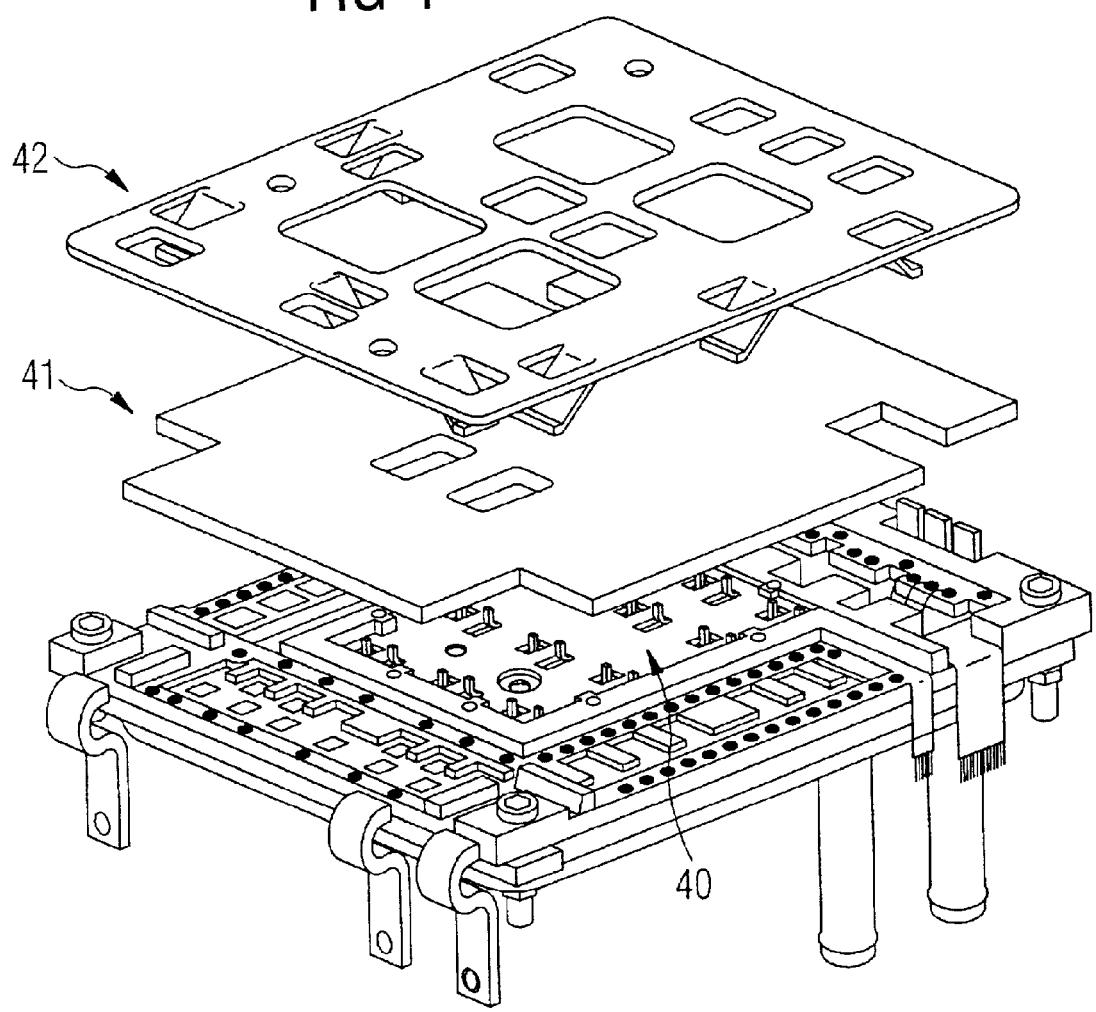
FIG. 4 shows an exploded illustration of a plastic frame according to the invention mounted on a heat sink, with a spring element.

FIG. 4 shows, in an exploded illustration, how a construction 40 in accordance with FIG. 3 can be covered with a plastic plate 41 and a spring element 42 can be arranged thereon. However, it is also possible to form the spring element in one piece with the plastic frame.

What is claimed is:

1. An electronic control unit comprising:
   a heat sink;
   a printed circuit board arranged on one side of said heat sink;
   a plastic frame comprising a plurality of cutouts and integrally formed snap-action elements, wherein the snap-action element fixedly couples said heat sink and printed circuit board to said plastic frame.

2. Electronic control unit as in claim 1, further comprising a deep drawn sheet arranged on the other side of said heat sink.

3. Electronic control unit as in claim 2, wherein said snap-action element further fixedly couples said deep drawn sheet with said heat sink.

4. Electronic control unit as in claim 2, wherein said snap-action element comprises a first snap element for coupling said heat sink and said printed circuit board to said plastic frame and a second snap element for coupling said deep drawn sheet with said heat sink.

5. Electronic control unit as in claim 1, wherein at least one of said cutouts encloses electrical/electronic component.

6. Electronic control unit as in claim 1, wherein at least one of said cutouts fixes the position of a busbar.

7. Electronic control unit as in claim 1, wherein at least one of said cutouts is filled with an encapsulation compound.

8. Electronic control unit as in claim 1, further comprising a housing for encapsulating said electronic unit, wherein said housing is coupled with said electronic control unit with screws.

9. Electronic control unit as in claim 1, wherein said plastic frame further comprises a spring element.

10. Electronic control unit as in claim 8, wherein said plastic frame further comprises a spring element whereby the housing exerts a force on said spring element thereby further fixing the position of said plastic frame and said circuit board with respect to said heat sink.

11. A plastic frame for the mounting of an electronic heavy-current control unit with cutouts wherein the cutouts provide positionally accurate reception of busbars, metal plates and electrical/electronic components and with integrally formed snap-action elements wherein the snap-action elements provide a connection to a heat sink.

12. The plastic frame as claimed in claim 11, further comprising a spring element.

13. The plastic frame as claimed in claim 11, wherein the heat sink is water-cooled.

14. The plastic frame as claimed in claim 11, wherein the plastic frame is arranged on one side of the heat sink, further comprising a deep drawn sheet arranged on the other side of said heat sink.

15. The plastic frame as claimed in claim 14, wherein said snap-action element comprises at least one snap element for coupling said deep drawn sheet, said heat sink and said plastic frame.

16. The plastic frame as claimed in claim 14, wherein said snap-action element comprises at least one first snap element for coupling said heat sink and said plastic frame and a second snap element for coupling said deep drawn sheet with said heat sink.

17. The plastic frame as claimed in claim 11, wherein at least one snap-action element comprises an opening for reception of a fastening element for securing said plastic frame to a housing.

18. The plastic frame as claimed in claims 17, wherein said fastening element is a screw.

19. The plastic frame as claimed in claim 11, wherein the cutouts are filled with an encapsulation compound.

20. Method of manufacturing a electronic control unit, comprising the steps of:
   providing a heat sink;
   arranging a circuit board on said heat sink;
   placing a plastic frame having a plurality of openings and integrally formed snap-action elements over said circuit board, wherein the snap-action elements fixedly couple said circuit board and said plastic frame; and
   filling at least one opening with an encapsulation compound.

* * * * *